United States Patent [19]

Bartoli et al.

[11] 4,439,691

[45] Mar. 27, 1984

[54] NON-INVERTING SHIFT REGISTER STAGE IN MOS TECHNOLOGY

[75] Inventors: Thomas J. Bartoli, Center Valley; Yehuda Rotblum, Allentown, both of Pa.

[73] Assignee: Bell Telephone Laboratories, Incorporated, Murray Hill, N.J.

[21] Appl. No.: 333,975

[22] Filed: Dec. 23, 1981

[51] Int. Cl.³ .................... H03K 3/295; H03K 3/29
[52] U.S. Cl. .................................... 307/279; 307/290; 377/79
[58] Field of Search ............... 377/74, 79, 105, 117, 377/121; 307/279, 290

[56] References Cited

U.S. PATENT DOCUMENTS

| 3,622,798 | 11/1971 | Ochi | 377/121 |
| 3,731,114 | 5/1973 | Gehweiler | 307/205 |
| 3,829,711 | 8/1974 | Crowle | 377/79 |
| 3,937,984 | 2/1976 | Fry | 377/79 |
| 4,071,784 | 1/1978 | Maeder et al. | 307/290 |
| 4,392,066 | 7/1983 | Hirao | 307/290 |

Primary Examiner—John S. Heyman
Assistant Examiner—Timothy P. Callahan
Attorney, Agent, or Firm—David I. Caplan

[57] ABSTRACT

A non-inverting integrated circuit shift register stage is provided by a combination of four interconnected N-MOS transistors, connected to a two-phase clock pulse voltage source.

3 Claims, 2 Drawing Figures

NON-INVERTING SHIFT REGISTER STAGE IN MOS TECHNOLOGY

TECHNICAL FIELD

This invention relates to the field of semiconductor circuits, and more particularly to shift registers in MOS technology.

BACKGROUND OF THE INVENTION

In many types of logic and computer circuits, it is desired to have circuit means for delaying a data stream of binary digital bits. A circuit device for accomplishing this purpose commonly is a shift register circuit. Such a shift register circuit is typically composed of one or more successive stages, the data stream being delayed by the same amount of time in each stage of the circuit. Of particular current interest are such circuits in N-MOS technology; that is, circuits formed with N-channel Metal Oxide Semiconductor transistors.

A useful shift register stage in prior art N-MOS technology has taken the form shown in FIG. 1, in which N-MOS transistors $T_2$ and $T_4$ are connected as "loads", $T_1$ and $T_3$ as "drivers", and in which $\phi_1$ and $\phi_2$ denote non-overlapping clock pulse voltage sequences; that is, only one (or none) of the sequences can be "high" at any instant of time. By "high" is meant that the pulse is of positive polarity sufficient to turn "on" an N-MOS transistor when the pulse is applied to the gate electrode of the transistor. By "low" is meant a pulse of lower positive voltage level (typically zero) than that corresponding to "high", sufficient to turn "off" the transistor.

In the shift register stage shown in the circuit of FIG. 1, an input signal $V_{in}$ ("high" or "low") subsequently appears as an output signal $V_{out}$ ("high" or "low"). More specifically, when a first clock pulse sequence $\phi$ goes "high", node $N_1$ also goes "high" regardless of $V_{in}$, because $T_2$ goes "on" regardless of $V_{in}$. When $\phi_1$ thereafter goes "low", $N_1$ goes "low" if and only if $V_{in}$ is then "high" and thus $T_1$ is "on", because then transistor $T_2$ is "off". A second clock pulse sequence, $\phi_2$, non-overlapping with respect to the first is applied to the serially connected source-drain paths of transistors $T_3$ and $T_4$. Thus, after $\phi_2$ subsequently goes "high" and then "low", node $N_2$ or $V_{out}$ then is "high" or "low" depending upon whether transistor $T_3$ is "off" or "on", respectively; that is, depending upon whether node $N_1$ is then "low" or "high", respectively, in turn depending upon whether $V_{in}$ was "high" or "low". Accordingly, $V_{out}$ during the "low" phase of $\phi_2$ represents the same binary state as $V_{in}$ represented during the "low" phase of $\phi_1$; and $V_{out}$ remains constant at this value until the next succeeding "low" phase of $\phi_2$.

The circuit shown in FIG. 1 thus effectuates an inversion of signal during each half-stage; that is to say, during the "low" phase of $\phi_1$ the signal at node $N_1$ is of the opposite polarity to that of the input signal $V_{in}$. In some application, however, such inversions may not be desired because of time delays associated with such inversions which limit the speed of operation. On the other hand, the shift register stage shown in FIG. 1 has the advantageous properties that it requires only four transistors and only one constant voltage (such as $V_{SS}$) access line. Moreover, the circuit shown in FIG. 1 has the disadvantage that in the case of a steady "low" input level (that is, a "low" level of input signal extending in time steadily over more than one clock cycle) the output is not a steady "low" level but goes to a "high" level during every "high" phase of $\phi_2$.

SUMMARY OF THE INVENTION

A shift register stage (FIG. 2) in N-MOS technology is arranged so that the signal is not inverted in the stage. In case of a steady input ("high" or "low"), the stage delivers a steady ouput ("high" or "low"). The stage comprises an input MOS transistor ($M_1$) whose high current (source-drain) path drives the gate electrode of an MOS driver transistor ($M_2$), the source-drain path of which is connected in series with the high current paths of both an MOS load transistor ($M_3$) and an MOS output transistor ($M_4$). Thus, but four transistor elements ($M_1$–$M_4$) can provide a non-inverting shift register stage. Also, the only DC voltage access line required is a $V_{SS}$ line, and no $V_{DD}$ line is required by the circuit, as will become clear from the detailed description below.

DETAILED DESCRIPTION

Figure 1:
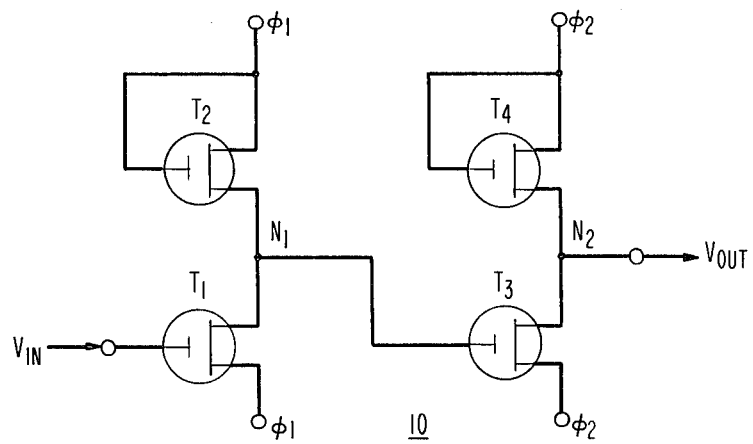
FIG. 1 is a schematic circuit diagram of a shift register stage in prior art.
Figure 2:
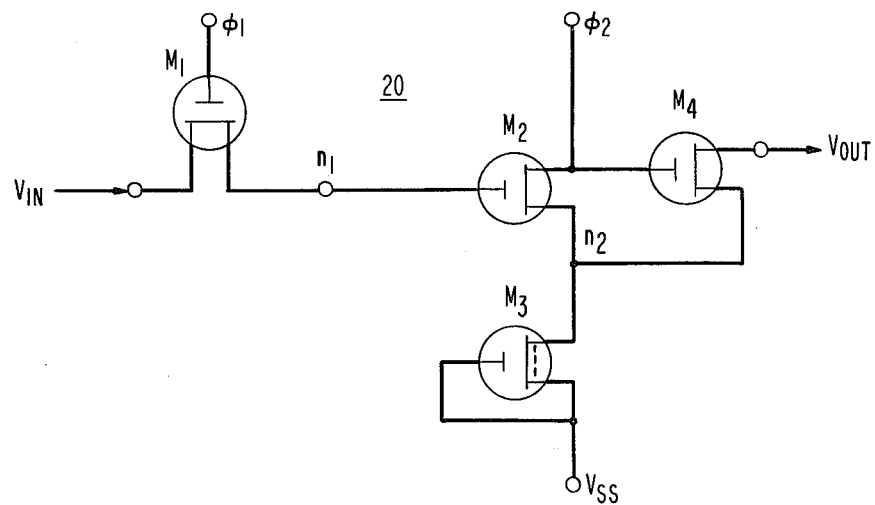
FIG. 2 is a schematic circuit diagram of a shift register stage in accordance with a specific embodiment of the invention.

As shown in FIG. 2, a shift register stage 20 includes a first N-MOS transistor $M_1$ to whose source terminal is applied a binary digital input signal $V_{in}$, and whose gate electrode is connected to a first clock pulse voltage source $\phi_1$. The drain terminal of $M_1$ is connected to the gate electrode of a second N-MOS transistor $M_2$ whose source terminal is connected to the drain terminal of a third N-MOS transistor $M_3$. The gate electrode of $M_3$ is connected to the source terminal of $M_3$ itself, and this source terminal is connected to a terminal $V_{SS}$ of a constant voltage access line for providing a DC voltage level $V_{SS}$. The source terminal of $M_2$ is also connected to the source terminal of a fourth N-MOS transistor $M_4$, and the drain terminal of $M_2$ is connected both to a second, non-overlapping clock pulse voltage source $\phi_2$ and to the gate electrode of $M_4$. The drain terminal of $M_4$ supplies the output voltage $V_{out}$ corresponding to the input $V_{in}$ delayed by a period of the clocks. The "on" impedance of $M_4$ is much less than the impedance of $M_3$, by a factor of at least about 5, and ordinarily by a factor of about 10 or more.

The clock pulse sequences $\phi_1$ and $\phi_2$ are mutually non-overlapping and are sometimes referred to as "master" and "slave" clocks, respectively. During operation, each of the sequences $\phi_1$ and $\phi_2$ provides "high" phases of voltage level $V_{DD}$ and provides "low" phases of voltage level $V_{SS}$ typically about 5 volts lower than $V_{DD}$.

In the case where the input $V_{in}$ is "high", the shift register stage 20 operates as follows. When $\phi_1$ goes "high", $M_1$ turns "on", and the node $n_1$ goes "high" by virtue of a positive charge, say $q_1$, on that node. Then $\phi_1$ goes "low", $M_1$ turns "off", and the charge $q_1$ remains on node $n_1$. Thereafter $\phi_2$ goes "high", $M_2$ is "on" due to $q_1$, so node $n_2$ goes "high"; and since $M_4$ also turns "on", because $\phi_2$ is "high", $V_{out}$ therefore also goes "high" because the "on" impedance of $M_4$ is much less than the impedance of $M_3$.

On the other hand, in case $V_{in}$ is "low", then when $\phi_1$ goes "high", the node $n_1$ goes "low" and stays "low"

during the next succeeding "high" phase of $\phi_2$. Meanwhile, load $M_3$ discharges node $n_2$ to its "low" state, so that when $\phi_2$ subsequently goes "high", the node $n_2$ remains "low" because then $M_2$ is "off" due to the "low" state of the node $n_1$. Accordingly, when $\phi_2$ thus goes "high" and hence $M_4$ turns "on", $V_{out}$ also will be "low".

Notice that the signal ("high" vs. "low" state) on both node $n_1$ and node $n_2$ is non-inverted with respect to the input signal $V_{in}$.

It should also be noted that the use of the term "high" in the preceding description of operation should be qualified by the fact that there will be some decrease in the value of the "high" input signal on passing through the stage 20, such decrease having been caused by transistor threshold voltage drops, particularly in transistor $M_2$. However, the voltage level of a "high" input will not be degraded on passing through the stage 20 in cases where this input level is itself below $V_{DD}$ by an amount equal to (or an amount somewhat greater than) these threshold voltage drops; therefore, connecting successive similar stages in cascade does not result in successive or cumulative degradation of signal. On the other hand, in case of a "low" $V_{in}$, the output level of $V_{out}$ will be independent of (reasonably limited) fluctuations of $V_{in}$. The output $V_{out}$ can be fed as $V_{in}$ to another, similar stage (not shown) or to other kinds of circuit elements as buffers formed by inverters, amplifiers, and the like. As known in the art, the stage 20 together with its circuitry for providing $V_{in}$ and for utilizing $V_{out}$ can be integrated on a single semiconductor body in accordance with standard integrated circuit techniques.

In a typical example by way of illustration only, the channel length to width ration (L/W) of $M_1$ is approximately $4\mu/8\mu$, of $M_2$ is approximately $4\mu/24\mu$, of $M_3$ is approximately $20\mu/5\mu$, and of $M_4$ is approximately $4\mu/8\mu$, which $V_{out}$ is fed to an N-MOS inverter driver transistor (not shown) of L/W equal to about $2\mu/30\mu$.

Advantageously the transistors $M_1$, $M_2$, and $M_4$ are low threshold voltage enhancement mode N-MOS transistors, typically of about 0.8 volt threshold; and the transistor $M_3$ is a depletion mode (indicated in FIG. 2 by the dotted line across the channel) N-MOS transistor with a threshold of typically about $-2.0$ volt. All these transistor thresholds are measured under zero back-gate bias voltage to the transistor. It is important that the threshold of the transistor $M_3$ corresponds to depletion mode (negative threshold), so that during operation $M_3$ is "on" and thus can discharge the node $n_2$ to ground. However, it should be understood that the substrate "ground"—i.e., the ground plane on the opposite major surface of the semiconductor body opposing the major surface where the circuit is integrated—can be maintained at $V_{SS}$ itself (zero back-gate bias). Alternatively, the ground plane can be maintained at a constant voltage different from $V_{SS}$, such as a voltage of about 4 or 5 volts (back-gate bias) lower than $V_{SS}$, in order to adjust the transistor thresholds if desired.

In another typical example, $V_{out}$ is fed to another similar shift register stage instead of to the driver of an inverter, the L/W ratio of $M_3$ is then changed to about $5\mu/5\mu$ and that of $M_4$ to about $4\mu/24\mu$, all other parameters remaining the same.

Although the invention has been described in terms of specific embodiments, various modifications can be made without departing from the scope of the invention. For example, instead of connecting the gate of transistor $M_3$ to $V_{SS}$, this gate electrode can be connected to an output terminal of an MOS inverter comprising a driver transistor, whose gate electrode is connected to the node $n_1$, in series with a load transistor, whose gate electrode is connected to $\phi_2$; thereby the transistor $M_3$ is turned "on" to discharge the node $n_2$ only when necessary—i.e., when and only when the input $V_{in}$ is "low" and $\phi_2$ is "high"—so that power is saved. Also, instead of N-MOS transistors, all transistors in the stage 20 can be P-MOS, so that the entire circuit can be fabricated in P-MOS technology.

What is claimed is:

1. A semiconductor integrated circuit comprising a shift register stage including:
   (a) a first MOS transistor having a gate electrode and a source and a drain terminal, the gate electrode being connected to a first clock pulse voltage source;
   (b) a second MOS transistor whose gate electrode is connected to the drain terminal of the first transistor;
   (c) a third MOS transistor whose gate electrode is connected to the source terminal thereof and whose drain terminal is connected to the source of the second transistor, the threshold of the third transistor corresponding to depletion mode; and
   (d) a fourth MOS transistor whose source terminal is connected to the drain terminal of the third transistor and whose gate electrode is connected to the drain terminal of the second transistor and to a second, non-overlapping clock pulse voltage source, whereby an input signal applied to the source terminal of the first transistor appears as a delayed, corresponding output signal at the drain of the fourth transistor.

2. The circuit of claim 1 in which the first, second, third, and fourth transistors are N-MOS transistors, the source terminal of the third transistor being connected to a DC voltage source terminal.

3. The circuit of claim 1 in which the first, second, third, and fourth transistors are N-MOS transistors, the "on" impedance of the fourth transistor being less than the impedance of the third transistor by a factor of at least about 5, and the first, second, and fourth transistors being enhancement mode transistors.

* * * * *